United States Patent
Yang et al.

(10) Patent No.: US 12,456,690 B2
(45) Date of Patent: Oct. 28, 2025

(54) MODULAR POWER OVERLAY DEVICE AND METHOD

(71) Applicant: GE AVIATION SYSTEMS LLC, Grand Rapids, MI (US)

(72) Inventors: Liqiang Yang, Gloversville, FL (US); Darrell Lee Grimes, Boca Raton, FL (US); Richard Anthony Eddins, Margate, FL (US); Shung Ik Lee, Pompano Beach, FL (US); Judd Everett Swanson, Plantation, FL (US)

(73) Assignee: GE AVIATION SYSTEMS LLC, Grand Rapids, MI (US)

( * ) Notice: Subject to any disclaimer, the term of this patent is extended or adjusted under 35 U.S.C. 154(b) by 655 days.

(21) Appl. No.: 17/738,498

(22) Filed: May 6, 2022

(65) Prior Publication Data
US 2023/0361049 A1     Nov. 9, 2023

(51) Int. Cl.
| | |
|---|---|
| H01L 23/538 | (2006.01) |
| H01L 23/14 | (2006.01) |
| H01L 23/485 | (2006.01) |
| H01L 25/18 | (2023.01) |
| H02M 7/5387 | (2007.01) |
| H05K 1/18 | (2006.01) |

(52) U.S. Cl.
CPC ........ *H01L 23/5386* (2013.01); *H01L 23/147* (2013.01); *H01L 23/485* (2013.01); *H01L 25/18* (2013.01); *H02M 7/5387* (2013.01); *H05K 1/181* (2013.01); *H05K 2201/10053* (2013.01); *H05K 2201/10166* (2013.01)

(58) Field of Classification Search
CPC . H01L 23/5386; H01L 23/147; H01L 23/485; H01L 25/18; H02M 7/5387; H05K 1/181; H05K 2201/10053; H05K 2201/10166
USPC .......................................... 257/773
See application file for complete search history.

(56) References Cited

U.S. PATENT DOCUMENTS

| | | | |
|---|---|---|---|
| 6,181,590 B1 | 1/2001 | Yamane | |
| 2002/0118560 A1 | 8/2002 | Ahmed | |
| 2005/0270745 A1 | 12/2005 | Chen et al. | |
| 2006/0007721 A1 | 1/2006 | Rodriguez et al. | |
| 2018/0206359 A1* | 7/2018 | McPherson | ........... H01L 25/072 |
| 2019/0181770 A1* | 6/2019 | Martin | ............... H05K 7/14329 |
| 2020/0091686 A1 | 3/2020 | Yang et al. | |

FOREIGN PATENT DOCUMENTS

| | | |
|---|---|---|
| JP | 2012244750 | 12/2012 |
| JP | 2014082484 | 5/2014 |
| KR | 1020210142760 | 11/2021 |
| WO | 2013145619 | 10/2013 |
| WO | 2014185050 | 11/2014 |

\* cited by examiner

*Primary Examiner* — Eric W Jones
(74) *Attorney, Agent, or Firm* — Fitch, Even, Tabin & Flannery LLP

(57) ABSTRACT

A modular POL component can be arranged to define a half-bridge converter topology, and can be coupled with other modular POL power components to define a full-bridge or 3-phase AC converter topology based on a desired power output. The assembled POL components can be mounted on a common electrically insulative substrate to define a POL power conversion device to provide the desired power output.

16 Claims, 9 Drawing Sheets

MODULAR POWER OVERLAY DEVICE AND METHOD

BACKGROUND

The growing demand for power electronic devices to manage high power densities has led to the development of the power electronic module or power module. The power module is an assembly typically including several power components, such as power semiconductor devices interconnected to perform a power conversion function. Power modules are used in power conversion equipment such as industrial motor drives, uninterruptible power supplies, and inverters. Power modules provide the packaging or physical containment for a set of power semiconductor components. The power semiconductors (or "dies") are typically soldered or sintered onto a power electronic substrate that supports the power semiconductors, provides electrical and thermal contact and electrical insulation where needed.

More recently, power modules increasingly employ a power overlay (POL) module type packaging and interconnect system. Such POL modules use multiple layers of conductive and insulative materials to support the power semiconductor devices, provide electrical interconnections between the semiconductor devices and external circuits, and manage heat generated during normal operation.

BRIEF DESCRIPTION OF THE DRAWINGS

A full and enabling disclosure of the present description, including the best mode thereof, directed to one of ordinary skill in the art, is set forth in the specification, which refers to the appended FIGS., in which.

DESCRIPTION OF EMBODIMENTS

Figure 1:
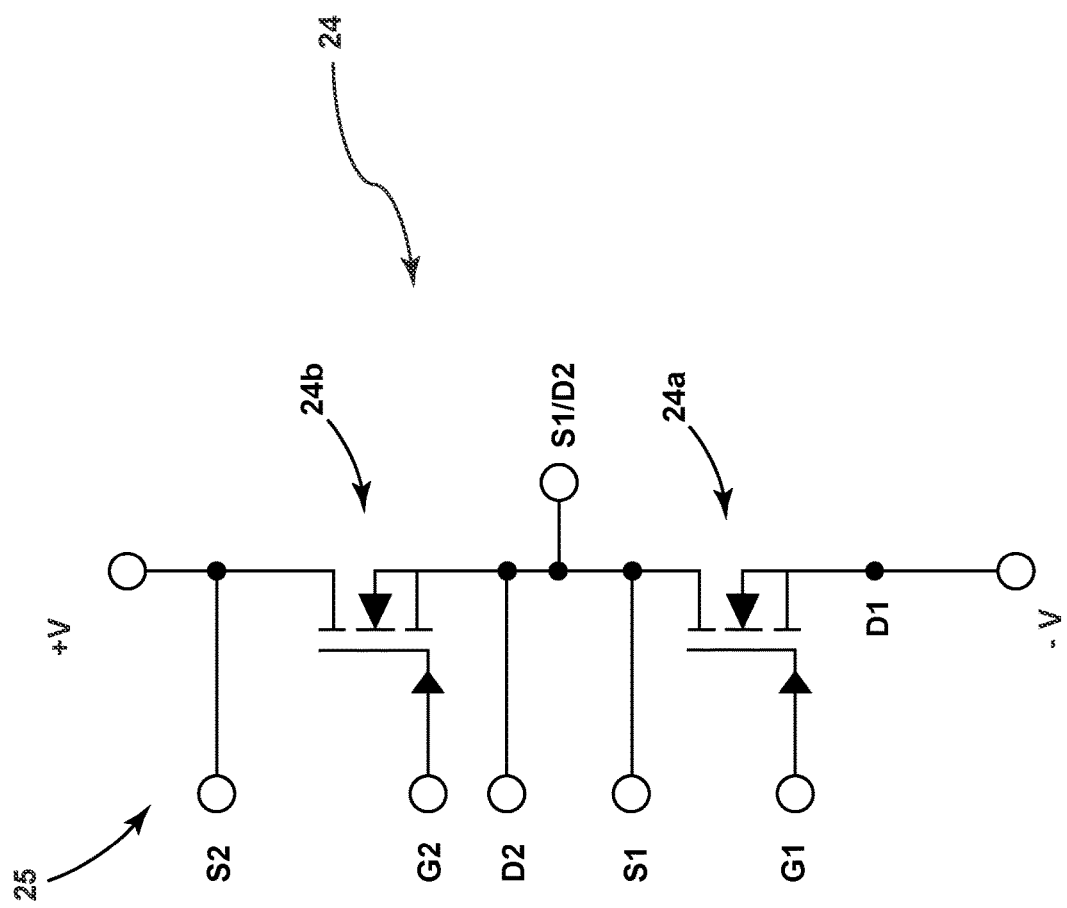
FIG. 1 illustrates a schematic diagram of a conventional half-bridge converter circuit.

As used herein, the term "set" or a "set" of elements can be any number of elements, including only one. As used herein, the singular forms "a," "an," and "the" include plural referents unless the context clearly dictates otherwise.

All directional references (e.g., radial, axial, upper, lower, upward, downward, left, right, lateral, front, back, top, bottom, above, below, vertical, horizontal, inboard, outboard) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other.

As used herein, the term "semiconductor device" refers to a semiconductor component, device, die or chip that perform specific functions such as a power transistor, power diode, or analog amplifier, as non-limiting examples. Typical semiconductor devices include input/output (I/O) interconnections, referred to herein as contacts or contact pads, which are used to connect the semiconductor device to external circuitry and are electrically coupled to internal elements within the semiconductor device. The semiconductor devices described herein can be power semiconductor devices used as electrically controllable switches or converters in power electronic circuits, such as switched mode power supplies, for example. Non-limiting examples of semiconductor devices include insulated gate bipolar transistors (IGBTs), metal oxide semiconductor field effect transistors (MOSFETs), bipolar junction transistors (BJTs), integrated gate-commutated thyristors (IGCTs), gate turn-off (GTO) thyristors, Silicon Controlled Rectifiers (SCRs), diodes or other devices or combinations of devices including materials such as Silicon (Si), Silicon Carbide (SiC), Gallium Nitride (GaN), and Gallium Arsenide (GaAs). Semiconductor devices can also be digital logic devices, such as a microprocessor, microcontroller, memory device, video processor, or an Application Specific Integrated Circuit (ASIC), as non-limiting examples.

It should be understood that for ease of description and understanding, the accompanying drawings are not necessarily drawn to scale, and may be depicted schematically. For example, certain elements in the drawings may be larger or smaller than illustrated, relative to other elements depicted in the drawings. While the various aspects of a POL module disclosed below are shown in the figures and described as including a particular arrangement of a semiconductor device, interconnection wiring and electronic package terminals, it is understood that alternative arrangements and configurations could also be implemented and thus aspects are not limited only to the specifically illustrated devices and arrangements thereof. That is, aspects described herein should also be understood to encompass electronics packages that might include additional electronic components and can additionally or alternatively include one or more alternative device types of semiconductor devices including acoustic devices, microwave devices, millimeter devices, RF communication devices, and micromechanical (MEMS) devices.

It is contemplated that aspects of the POL components and modular devices as disclosed herein can comprise a semiconductor device module or power module providing interconnection and physical support or containment for one or more semiconductor devices defining a topology. Aspects described herein can also include one or more resistors, capacitors, inductors, filters, switches and similar devices and combinations thereof. As used herein the terms "electrical component" and "electronic component" can be understood to encompass any of the various types of semiconductor devices described above as well as resistors, capacitors, inductors, filters and similar passive devices, and energy storage components.

The POL packaging and interconnect device or module provides the physical containment for the power components, including power semiconductor devices. These power semiconductors, or dies, are typically soldered or sintered on a power electronic substrate that supports the power semiconductors, and provides electrical and thermal contact and electrical insulation, thereby enabling a higher power density than discrete power components.

One notable feature of conventional POL component architecture is a planar copper interconnection structure. Instead of conventional wire bonds, devices in a typical POL interconnection arrangement connect directly to device connection pads by way of vias formed through an insulative polyimide adhesive layer, with passive elements (e.g. resistors, capacitors, and inductors) installed or built-up as needed.

A conventional POL device manufacturing process typically begins with placement of one or more power semiconductor devices onto a dielectric layer by way of an adhesive. Metal interconnects (e.g., copper interconnects) are then electroplated onto the dielectric layer to form a direct metallic connection to the power semiconductor device(s) by way of the vias defined through the dielectric layer. The metal interconnects provide for the formation of an input/output (I/O) system to and from the power semiconductor device(s). The POL component is then soldered to an insulated metal substrate (for example, a direct bond copper (DBC) substrate) using soldered interconnections for electrical and thermal connectivity. Gaps around the semiconductor devices between the dielectric layer and the ceramic substrate are then filled using a dielectric organic material to form the POL component.

The conventional insulated metal substrates often consist of three layers, i.e., a metal top layer and metal bottom layer with a ceramic insulating layer sandwiched in between. The insulating layer of the insulated metal substrate electrically insulates the metal top layer from the metal bottom layer. The metal layers are either directly bonded or brazed to the ceramic layer. The metal insulated substrate typically can be soldered on an opposite side (e.g., a bottom side) to a baseplate. In many cases, the baseplate is formed of copper and attached to the bottom metal layer of the metal insulated substrate using solder. The baseplate is typically further mounted to a conventional heat sink. The conventional metal insulated substrate is commonly used in POL components, due to their thermal conductivity and rigidity, to support the semiconductor devices while simultaneously providing an electrical interconnect structure. The rigidity of the baseplate provides additional structural support for the POL component. The insulating layer portion of the metal insulated substrate can also provide electrical isolation between the devices and a heatsink or chassis.

Conventional POL components are often used in electrical power converters, such as in AC drives and flexible AC transmission systems. A power converter is a power supply or power processing circuit that converts an input voltage waveform into a specified output voltage waveform. Controllers associated with the power converters manage an operation thereof by selectively controlling the conduction periods of switches employed therein. The switches employed by the power converter are typically semiconductor switching devices (e.g., MOSFETs, IGBTs, etc.).

In combination with the controller, a drive circuit (for example, a gate drive circuit) is conventionally employed to selectively provide a drive signal to a control terminal (e.g., a gate terminal) of each semiconductor switch to control an operation thereof in response to a command signal (for example, a pulse-width modulated (PWM) signal) from the controller.

Reference now will be made in detail to aspects, one or more examples of which are illustrated in the drawings. Each example is provided by way of explanation of the aspects, not limitation of the aspects. In fact, it will be apparent to those skilled in the art that various modifications and variations can be made in the present disclosure without departing from the scope or spirit of the disclosure. For instance, features illustrated or described as part of one aspect can be used with another aspect to yield a still further aspect. Thus, it is intended that the present disclosure covers such modifications and variations as come within the scope of the appended claims and their equivalents.

Although various non-limiting aspects are depicted and described herein using various switching devices such as MOSFETS or IGBTs or a combination thereof, other aspects are not so limited. Other non-limiting aspects can include any desired switching device that can switch a state between a low resistance state and a high resistance state in response to an electrical signal. For example, the switching devices in various aspects can comprise, without limitation, any desired type of switching element including for example, transistors, gate commutated thyristors, field effect transistors (FETs), IGBTs, MOSFETs, gate turn-off thyristors, static induction transistors, static induction thyristors, and combinations thereof.

As will be described in more detail herein, non-limiting aspects can be arranged to define a half-bridge power converter topology. FIG. 1 depicts an electrical schematic view of a conventional half-bridge power converter topology for reference. As will be appreciated, the schematic view of FIG. 1 illustrates a set of semiconductor switching devices 24 depicted as a pair of complimentary n-channel MOSFET switching devices arranged to form a conventional half-bridge converter circuit 25. The pair of semiconductor switching devices 24 can include a first semiconductor switching device 24*a* and a second semiconductor switching device 24*b*. The first semiconductor switching device 24*a* can comprise a first source terminal S1, first gate terminal G1, and first drain terminal D1. Likewise, the second semiconductor switching device 24*b* can comprise a second source terminal S2, second gate terminal G2, and second drain terminal D2.

As shown, the first source terminal S1 of first semiconductor switching device 24*a* is electrically coupled to the second drain terminal D2 of the second semiconductor switching device 24*b* to define an output neutral or single-phase AC output node or terminal S1/D2. In operation, a positive DC voltage (+V), can be provided to the second source terminal S2, and a negative DC voltage can be provided to the first drain terminal D1. The gate terminals G1, G2 of the respective first and second semiconductor switching devices 24*a*, 24*b* can be communicatively coupled to a gate driver device or circuit (not shown) configured to operate the first and second semiconductor switching devices 24*a*, 24*b* between conducting and non-conducting states at a predetermined frequency to thereby provide a sinusoidal waveform output or AC voltage with respect to the output neutral, or single-phase AC output terminal S1/D2.

Figure 2:
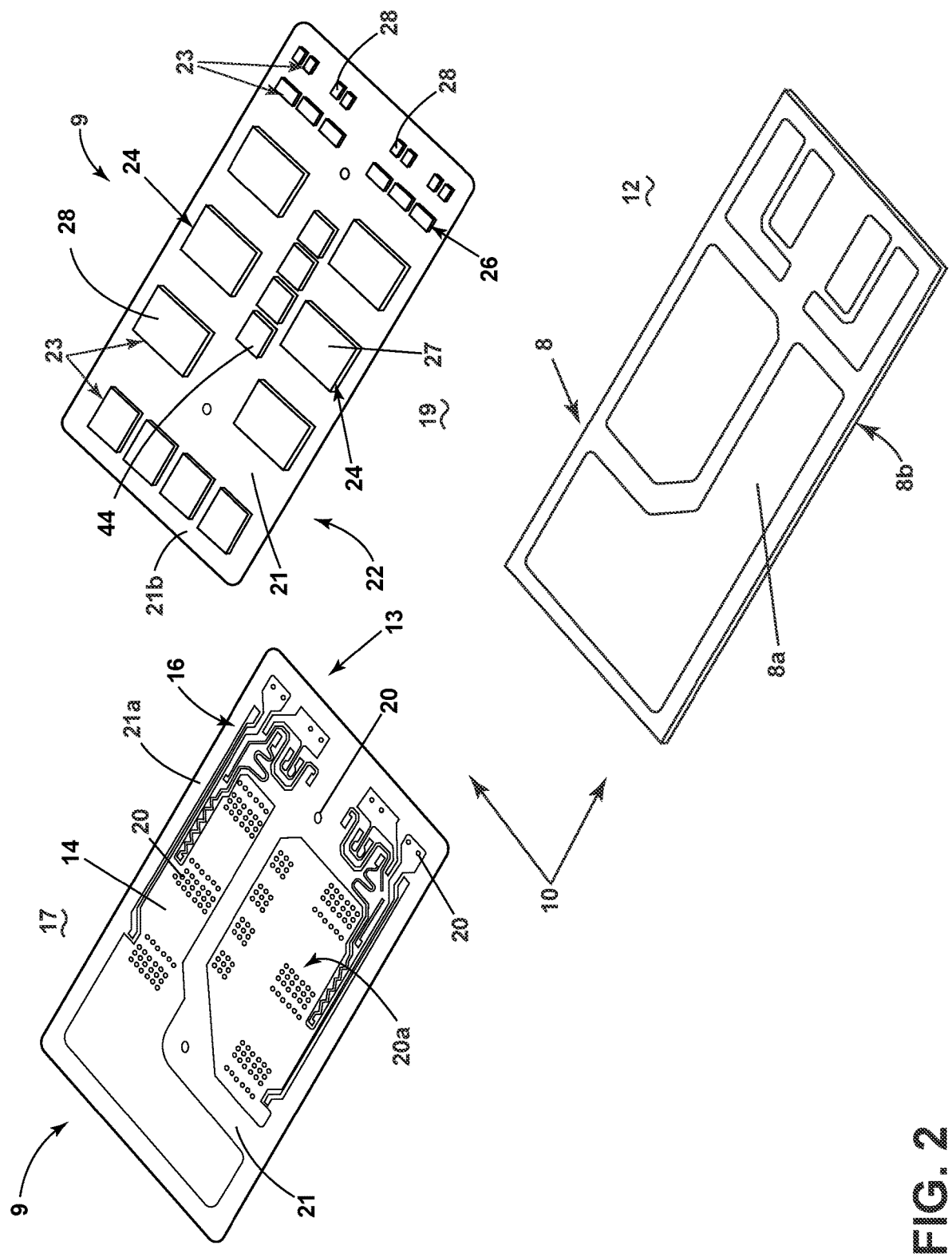
FIG. 2 illustrates a set of isometric views of a first POL component, in accordance with various aspects described herein.

FIG. 2 illustrates a non-limiting aspect of a first POL component 10 in accordance with a non-limiting aspect. For example, the first POL component 10 can include a POL sub-assembly 9 having a top portion 13, shown in isometric view 17, and a bottom portion 22, shown in a bottom-up isometric view 19. Stated another way, the isometric views 17 and 19 are illustrating the same POL sub-assembly 9 from different perspectives. The first POL component 10 can further include an electrically conductive substrate 8, shown in isometric view 12. As will be described in more detail herein, the bottom portion 22 of the POL sub-assembly 9 can be coupled to the electrically conductive substrate 8 to form the first POL component 10. In this way, the bottom portion 22 is sandwiched between the top portion 13 and the electrically conductive substrate 8.

The top portion 13 can include a top electrically conductive layer 14 (e.g., a metallized layer) disposed upon a first side (e.g. a top side) 21a of an electrically insulative or non-conductive dielectric layer 21. The top conductive layer 14 can include a set of conductive traces 16 disposed thereon. The dielectric layer 21 can comprise a second side (e.g., a bottom side) 21b opposing the first side 21a. The dielectric layer 21 can define a set of apertures 20 therethrough, extending from the first side 21a to the second side 21b. In aspects, the top conductive layer 14 can extend through the apertures 20 to define a set of vias 20a through the dielectric layer 21. In non-limiting aspects, one or more electrically conductive elements, such as conductive shims 44 (e.g., copper shims) can be disposed on the on the top conductive layer 14. The bottom portion 22 can include a set of electrical devices 23 disposed on the second side 21b.

As shown, the first POL component 10 can define a substantially planar arrangement of the set of electrical devices 23 arranged on the dielectric layer 21 and defining a first planar footprint. The top conductive layer 14 can be electrically coupled with the set of electrical devices 23. For example, in some aspects, the top conductive layer 14 can be electrically connected with the set of electrical devices 23 by way of the set of vias 20a defined through the dielectric layer 21. Additionally, or alternatively, in some aspects the top conductive layer 14 can be electrically coupled to the electrically conductive substrate 8 by way of the set of vias 20a, or the set of conductive shims 44, or both.

The set of electrical devices 23 can include a set of semiconductor switching devices 24. For example, in some non-limiting aspects, the semiconductor switching devices 24 can include silicon carbide switching devices. As one non-limiting example, the set of semiconductor switching devices 24 can include MOSFET type switches. It will be appreciated that in such aspects, each of the semiconductor switching devices 24 can include respective gate ("G"), source ("S"), and drain ("D") terminals (not shown, see FIG. 1). In non-limiting aspects, the semiconductor switching devices 24 can include a first side 27 (e.g., a top side), and an opposing second side e.g., a bottom side (not visible in FIG. 2). In non-limiting aspects, the gate terminal G and drain terminal D of the semiconductor switching devices 24 can be disposed on opposing sides of the respective semiconductor switching device 24. For example, in non-limiting aspects, the source terminal S and gate terminal G can be disposed on the semiconductor switching devices 24 first side 27, and the drain terminal D can be disposed on the opposing second side of the respective semiconductor switching devices 24.

In some aspects, the set of electrical devices 23 can further include a set of rectifying components 26. For example, in some non-limiting aspects, the rectifying components 26 can comprise diodes. In other non-limiting aspects, the rectifying components can include additional semiconductor switching devices 24, diodes, or a combination thereof. The set of electrical devices 23 can further include a set of gate driver devices 28 (e.g., MOSFET gate driver devices) electrically coupled to the semiconductor switching devices 24, configured to selectively operate the respective gates of the semiconductor switching devices 24, for example by providing a gate drive signal (not shown) thereto in a known manner.

In some aspects, the top conductive layer 14 of the first POL component 10 can be electrically connected with the set of semiconductor switching devices 24. For example, in some aspects, the top conductive layer 14 of the first POL component 10 can be electrically coupled with the set of semiconductor switching devices 24 (e.g., to the source terminal S and gate terminal G) by way of the conductive vias 20a through the dielectric layer 21.

In non-limiting aspects, the electrically conductive substrate 8 can comprise an insulated metal substrate, such as a DBC substrate. The electrically conductive substrate 8 can define a first surface 8a (e.g., a top surface) and an opposing second surface 8b (e.g., a bottom surface). The first and second surfaces 8a, 8b of the electrically conductive substrate can be formed of an electrically conductive material (e.g., copper). An electrically insulative layer (not shown) can be disposed between the first and second surfaces 8a, 8b of the electrically conductive substrate 8 to electrically insulate the first surface 8a from the second surface 8b. The first surface 8a can be electrically coupled (e.g., soldered) to the set of semiconductor switching devices 24). For example, in non-limiting aspects, first surface 8a can be electrically coupled to the respective drain terminals D of one or more of the semiconductor switching devices 24. In non-limiting aspects, the first surface 8a of the electrically conductive substrate 8 can be electrically coupled to the top conductive layer 14 via the conductive shims 44 or the vias 20a, or both. The electrically conductive substrate 8 can be arranged to support the semiconductor switching devices 24 while simultaneously providing an electrical interconnect structure.

Figure 3A:
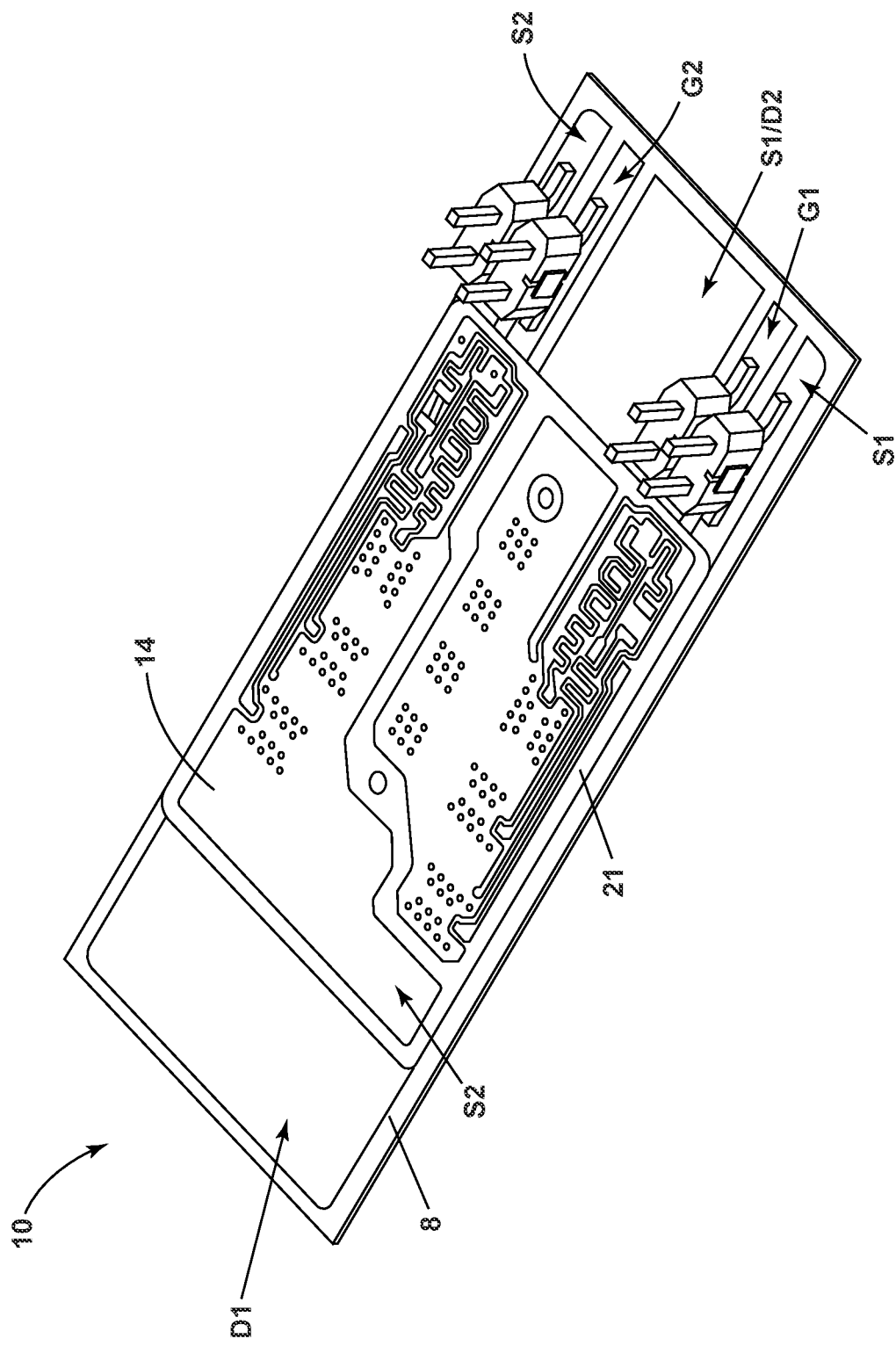
FIG. 3A illustrates an isometric view of a modular POL device, in accordance with various aspects described herein.

For example, FIG. 3A depicts a perspective view of another non-limiting aspect of the first POL component 10 with the set of semiconductor switching devices 24 and other parts omitted for clarity. In non-limiting aspects. the POL sub-assembly 9 can be coupled to the electrically conductive substrate 8 and arranged to define a first half-bridge power converter topology. For example, the first source terminal Si of first semiconductor switching device 24a can be electrically coupled to the second drain terminal D2 of the second semiconductor switching device 24b to define the output neutral or single-phase AC output node or terminal S1/D2 at an outer portion of the conductive substrate 8. An AC output terminal (omitted for clarity) can be coupled to the single-phase AC output node or terminal S1/D2 at the outer portion of the conductive substrate 8.

Figure 3B:
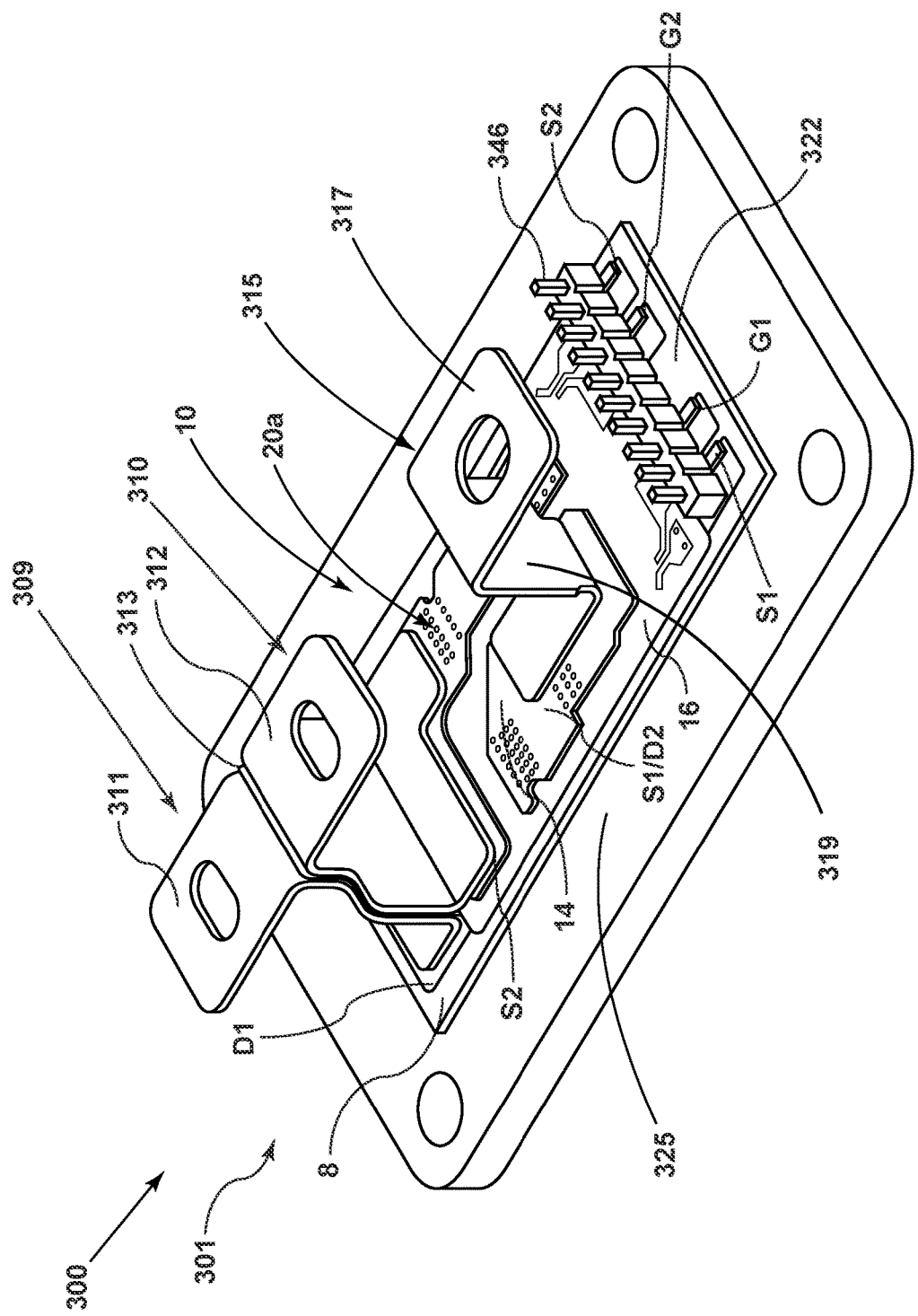
FIG. 3B illustrates an isometric view of another modular POL device in accordance with various aspects described herein.

With reference to FIG. 3B, a perspective view of a non-limiting aspect of a half-bridge modular POL device 300 is shown. In non-limiting aspects, the half-bridge modular POL device 300 can define a half-bridge power converter. In non-limiting aspects, the first POL component 10 can be arranged to define a first half-bridge POL component 301. The half-bridge modular POL device 300 can include the first half-bridge POL component 301 (comprising the first POL component 10) supportably mounted or assembled onto an electrically insulative or non-conductive baseplate 325 or tile. In non-limiting aspects, the electrically insulative baseplate 325 can be both electrically and thermally insulative. In other non-limiting aspects, the electrically insulative baseplate 325 can be electrically insulative and thermally conductive. Additionally, non-limiting aspects of the first half-bridge POL component 301 can further include a first DC input node 309 and a second DC input node 310. The first DC input node 309 can include a first DC input terminal 311. The second DC input node 310 can include a second DC input terminal 312. The first DC input terminal 311 can be arranged to receive a first DC voltage (V+) having a first polarity, and the second DC input terminal 312 can be arranged to receive a second DC voltage (V−) having a second polarity. The first half-bridge POL component 301 can further include an AC output terminal 315 (e.g., a single-phase AC output terminal) extending therefrom. As can be seen, the locations of the first source terminal Si of the first semiconductor switching device 24a, the second drain terminal D2 of the second semiconductor switching device 24b can alternatively be defined in different locations on the top conductive layer 14 than those depicted in FIG. 3A.

As will be described in more detail herein, in non-limiting aspects, the half-bridge modular POL device 300 can be selected and arranged to define a modular component that can define a "half-bridge building block" or modular half-bridge circuit element that can be selectively and advantageously combined with other half-bridge modular POL devices 300 in various arrangements to modularly build a desired circuit. The selection of the first half-bridge POL component 301, can be based on a predetermined AC power output conversion demand.

In non-limiting aspects of the first half-bridge POL component 301, the set of electrical devices 23 of the first POL component 10 depicted in FIG. 2 can be electrically coupled and arranged to define a half-bridge power converter electrical topology. For example, in non-limiting aspects, the set of electrical devices 23 of the first POL component 10 can be arranged to define the half-bridge power converter circuit 25 illustrated in FIG. 1. The set of semiconductor switching devices 24 of the first POL component 10 can be selectively operable in response to gate signals delivered by way of the set of conductive traces 16 from the set of gate driver devices 28 (FIG. 2). It will be appreciated that while the half-bridge power converter circuit 25 of FIG. 2 was described as comprising a pair of semiconductor switching devices 24, aspects are not so limited, and non-limiting aspects of the first half-bridge POL component 301 can include any desired number of semiconductor switching devices 24 arranged to define a half-bridge power converter electrical topology.

Referring again to FIG. 3B, in non-limiting aspects, the conductive first surface 8a (see FIG. 2) of the electrically conductive substrate 8, or the top conductive layer 14, or both can be electrically coupled with a respective drain terminal of at least one semiconductor switching device 24 (shown in FIG. 2). In this sense, the first surface 8a of the electrically conductive substrate 8, or the top conductive layer 14, or both can be arranged to define the first drain terminal D1 of the first half-bridge POL component 301. Additionally, the top conductive layer 14, or the first surface 8a of the electrically conductive substrate 8, or both, of the first POL component 10 can be electrically coupled with a respective source terminal of at least one semiconductor switching device 24 to define the first source terminal Si for the first POL component 10. Thus, the top conductive layer 14 or the first surface 8a of the electrically conductive substrate 8, or both, can define the first source terminal S1 for the first half-bridge POL component 301. In non-limiting aspects, the first DC input terminal 311 can be electrically coupled to the first drain terminal D1, and the second DC input terminal 312 can be electrically coupled to the second source terminal S2.

In non-limiting aspects of the first half-bridge POL component 301, the source terminal S1 of the first semiconductor switching device 24a can be electrically shorted to the second drain terminal D2 of the second semiconductor switching device 24b. In non-limiting aspects, one or more of the conductive shims 44, can be disposed in electrical communication with on the top conductive layer 14 and the electrically conductive substrate 8 to thereby provide a direct low impedance conductive path (i.e., short circuit) from the first source terminal Si of the first semiconductor switching device 24a to the second drain terminal D2 of the second semiconductor switching device 24b (see FIG. 1). Accordingly, in such aspects, the first source terminal Si of the first semiconductor switching device 24a can be shorted to the second drain terminal D2 of the second semiconductor switching device 24 to thereby form or define the first AC output terminal 315 of the first half-bridge POL component 301 on the top conductive layer 14. As shown, the first source terminal S1 of first semiconductor switching device 24a is electrically coupled to the second drain terminal D2 of the second semiconductor switching device 24b to define an output neutral or single-phase AC output node or terminal S1/D2 on the top conductive layer 14. Other aspects are not so limited, and the single-phase AC output node or terminal S1/D2 can alternatively be defined on the electrically conductive substrate 8.

The first DC input terminal 311, the second DC input terminal 312, and the first AC output terminal 315 can be formed of a conductive material (e.g., copper) and extend normally outward and away from the first half-bridge POL component 301 (or a planar top surface thereof). Each of the first DC input terminal 311, the second DC input terminal 312, and the first AC output terminal 315 can be configured or adapted, for example, to receive a mechanical screw-type interface for conductively connecting with a respective input or output conductor (not shown).

Continuing with FIG. 3B, in non-limiting aspects, a non-conductive or first electrically insulative layer 313 comprising an electrically insulative material (e.g., an insulative sheet) can be disposed between the first DC input terminal 311 and the second DC input terminal 312, to prevent conductive contact between the first DC input terminal 311 and second DC input terminal 312, while allowing the first DC input terminal 311 and the second DC input terminal 312, to non-conductively abut each other, for example, for added strength or rigidity. For example, in non-limiting aspects the first electrically insulative layer 313 can comprise a non-conductive powder coating disposed on the first DC input terminal 311, the second DC input terminal 312, or both. A conductive surface portion 317 can be arranged over a connector portion of the first AC output terminal 315, and a non-conductive surface portion 319 over another portion of the first AC output terminal 315. The non-conductive surface portion 319 can insulate the first AC output terminal 315 from proximal conductive parts. In non-limiting aspects, a cover (not shown) can optionally be attached to the electrically insulative baseplate 325 to at least partially enclose the half-bridge modular POL device 300.

The first half-bridge POL component 301 is also shown to have a pinout assembly 346 electrically coupled with a corresponding first and second gate terminals G1, G2, and further electrically coupled to the set of gate driver devices 28 (see FIG. 2). In this non-limiting example, the pinout assembly 346 extends normally upward and away from the first half-bridge POL component 301 (or a planar top surface thereof). However, other aspects are not so limited, and the pinout assembly 346 can optionally extend in any desired direction without departing from the scope of the disclosure herein.

The first half-bridge POL component 301 is mounted or supportably received onto the electrically insulative baseplate 325 to form the half-bridge modular POL device 300. Each first half-bridge POL component 301 can thus define a modular assembly that can optionally be used as a building block element that can be selectively combined with one or more additional first half-bridge POL components 301 to define a desired circuit topology mounted on a common electrically insulative baseplate 325. In this way, aspects as described herein can enable fully configurable power converter modules, such as a full-bridge converter circuit, through the selective combinations of the half-bridge POL component 301.

Figure 4:
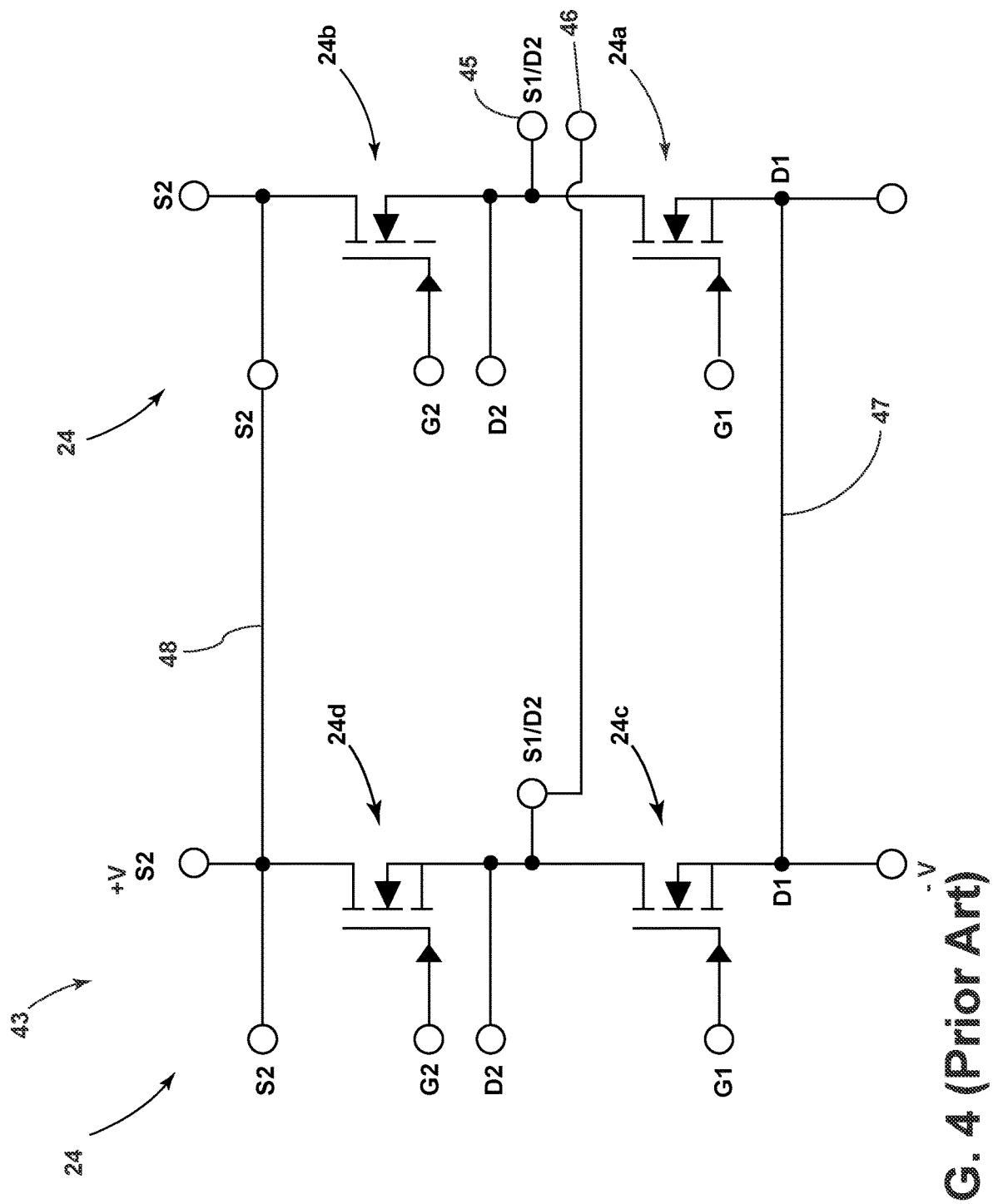
FIG. 4 illustrates a schematic diagram of a conventional half-bridge converter circuit.

FIG. 4 depicts an electrical schematic view of a conventional full-bridge converter circuit 43 for reference. As will be appreciated, the full-bridge converter circuit comprises two pairs of complimentary semiconductor switching devices 24 depicted as n-channel MOSFET devices. The two pairs of semiconductor switching devices 24 can include the first semiconductor switching device 24a, the second semiconductor switching device 24b, a third semiconductor switching device 24c, and a fourth semiconductor switching device 24d. Each of the four semiconductor switching devices 24a, 24b, 24c, 24d can comprise a respective source terminal S, gate terminal G, and drain terminal D.

As shown, the first source terminal Si of the first semiconductor switching device 24a is electrically coupled to the second drain terminal D2 of the second semiconductor switching device 24b to define a first AC output terminal 45 (S1/D2). Additionally, the first source terminal S1 of the third semiconductor switching device 24c is electrically coupled to the second drain terminal D2 of the fourth semiconductor switching device 24d to define a second AC output terminal 46 (S1/D2). A first conductive line 47 can be arranged to electrically couple the first drain terminal D1 of the first semiconductor switching device 24a, and the first drain terminal D1 of the third semiconductor switching device 24c. A second conductive line 48 can electrically couple the second source terminal S2 of the second semiconductor switching device 24b, and the second source terminal S2 of the fourth semiconductor switching device 24d.

In operation, a positive DC voltage (+V), can be provided to the second source terminal S2 of the second semiconductor switching device 24b, and the second source terminal S2 of the fourth semiconductor switching device 24d. A negative DC voltage (−V) can be provided to the first drain terminal D1 of the first semiconductor switching device 24a and the first drain terminal D1 of the third semiconductor switching device 24c. The respective gate terminals G1, G2 of the four semiconductor switching devices 24a, 24b, 24c, 24d can be electrically coupled to one or more gate driver devices or circuits (not shown) configured to operate the respective semiconductor switching devices 24a, 24b, 24c, 24d between conducting and non-conducting states at a predetermined frequency to thereby provide a sinusoidal or AC waveform output across the first AC output terminal 45 and second AC output terminal 46.

Figure 5:
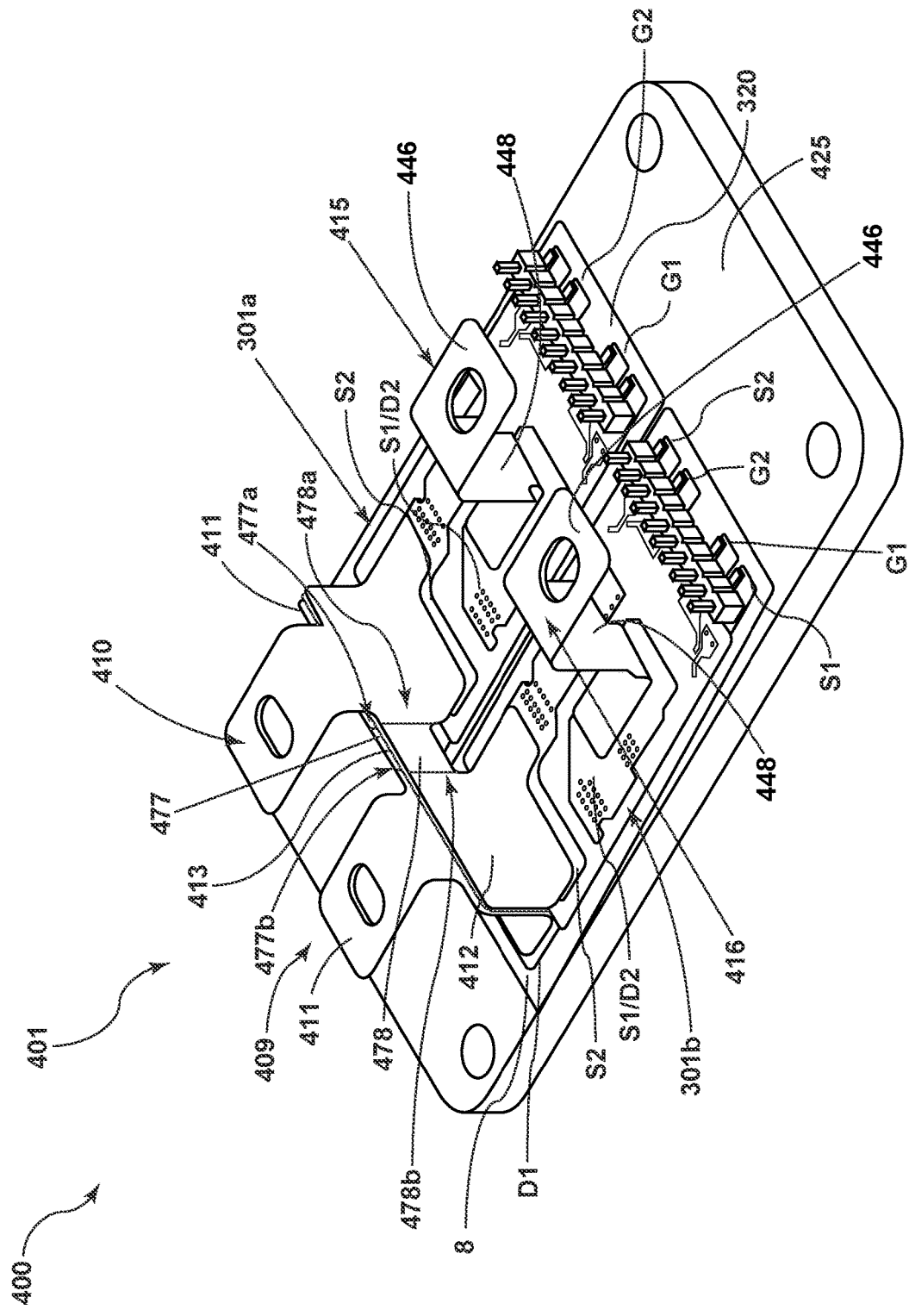
FIG. 5 illustrates a perspective view of another modular POL device, in accordance with various aspects described herein.

FIG. 5 depicts a non-limiting aspect of a full-bridge modular POL device 400. In non-limiting aspects, the full-bridge modular POL device 400 can define a full-bridge power converter circuit. The full-bridge modular POL device 400 can comprise two first half-bridge POL components 301 selected and arranged to cooperatively define a full-bridge POL module 401 mounted on a common electrically insulative baseplate 425. For example, in non-limiting aspects, a pair of first half-bridge POL components 301, comprising a first half bridge POL component 301a, and a second half-bridge POL component 301b can be assembled, and the pair of half-bridge POL components 301 can then be electrically coupled to each other to cooperatively define the full-bridge POL module 401. The full-bridge POL module 401 can be assembled onto the common electrically insulative baseplate 425, to define the full-bridge modular POL device 400. The selection of the pair of half-bridge POL components 301, can be based on a predetermined AC power output conversion demand.

It will be appreciated that while FIG. 5 depicts the first and second half-bridge POL components 301a, 301b defining the full-bridge POL module 401 being disposed on a single or unitary common electrically insulative baseplate 425, other aspects are not so limited. It is contemplated that in other non-limiting aspects, the electrically insulative common baseplate 425 can comprise set of electrically insulative baseplate segments (not shown) arranged to be selectively coupled together to form or define the common electrically insulative baseplate 425.

Non-limiting aspects of the full-bridge POL module 401 can include a first DC input node 409 and a second DC input node 410. The first DC input node 409 can be arranged to receive a first DC voltage (V−) having a first polarity, and the second DC input node 410 can be arranged to receive a second DC voltage (V+) having a second polarity. The first DC input node 409 can include a first DC input terminal 411. The second DC input node 410 can include and a second DC input terminal 412. For example, the first DC input terminal 411 of the full-bridge POL module 401 can comprise the respective first DC input terminals 311 (depicted in FIG. 3B) of the first and second half-bridge POL components 301a, 301b, electrically coupled to each other. Likewise, in non-limiting aspects, the second DC input terminal 412 of the full-bridge POL module 401 can include the respective second DC input terminals 312 (depicted in FIG. 3B) of the first and second half-bridge POL components 301a, 301b, electrically coupled to each other. Additionally, non-limiting aspects of the full-bridge POL module 401 can further include a first AC output terminal 415 and a second AC output terminal 416 extending therefrom. In non-limiting aspects, the first AC output terminal 415 can correspond to the first AC output terminal 315 (depicted in FIG. 3B) of the first half-bridge POL component 301a, and the second AC output terminal 416 can correspond to the first AC output terminal 315 (depicted in FIG. 3B) of the second half-bridge POL component 301b.

In non-limiting aspects, and with additional reference to FIGS. 1 and 4, the second DC input terminal 412 of the first and second half-bridge POL components 301a, 301b forming the full-bridge POL module 401 can be electrically coupled to the second source terminal S2 of the second semiconductor switching device 24b of the respective first half-bridge POL component 301a. In non-limiting aspects, the respective second DC input terminal 412 can be further electrically coupled to the second source terminal S2 of the fourth semiconductor switching device 24d of the second half-bridge POL component 301b to define the second DC input terminal 412 of the full-bridge POL module 401.

In non-limiting aspects, the first and second half-bridge POL components 301a, 301b of the full-bridge POL module 401 can include a respective first DC input terminal 411 electrically coupled to the respective drain terminal D1 of the first and second half-bridge POL components 301a, 301b. A first conductive member 477 can be disposed between and electrically coupled to each of the respective first DC input terminals 411 to cooperatively define the first DC input terminal 411 of the full-bridge POL module 401. For example, the first conductive member 477 can be electrically coupled at a first end 477a to the first DC input terminal 411 of the first half-bridge POL component 301a, and electrically coupled at a second end 477b to the respective first DC input terminal 311 of the second half-bridge POL component 301b. In this way, the first conductive member 477, and the respective first DC input terminals 411 of the first and second half-bridge POL components 301a, 301b, are electrically coupled together as a node to define the first DC input terminal 411.

In non-limiting aspects, the first and second half-bridge POL components 301a, 301b of the full-bridge POL module 401 can include a respective second DC input terminal 312 electrically coupled to the respective second source terminal S2 of the first and second half-bridge POL components 301a, 301b. A second conductive member 478 can be disposed between and electrically coupled to each of the respective second DC input terminals 312 to cooperatively define the second DC input terminal 412 of the full-bridge POL module 401. For example, the second conductive member 478 can be electrically coupled at a first end 478a to the second DC input terminal 312 of the first half-bridge POL component 301a, and electrically coupled at a second end 478b to the second source terminal S2 of the fourth semiconductor switching device 24d of the first half-bridge POL component 301a. In this way, the second conductive member 478, and the respective second DC input terminals 312 of the first and second half-bridge POL components 301a, 301b are electrically coupled together as a node to define the second DC input terminal 412.

Each of the DC input terminals 410 can be configured or adapted, for example, to receive a mechanical screw-type interface for conductively connecting with a respective input conductor (not shown). A non-conductive or second electrically insulative layer 413 comprising an electrically insulative material (e.g., an insulative sheet) can be disposed between the first DC input terminal 411 and second DC input terminal 412 to prevent conductive contact between the first and second DC input terminals 411, 412 while allowing the first and second DC input terminals 411, 412 to non-conductively abut each other, for example, for added strength or rigidity. In non-limiting aspects, the second electrically insulative layer 413 can include a non-conductive powder coating disposed on the first DC input terminal 411, the second DC input terminal 412, or both. In still other non-limiting aspects, the second electrically insulative layer 413 can comprise an air gap or space between the first DC input terminal 411 and second DC input terminal 412.

Each of the first and second AC output terminals 415, 416 can be configured or adapted, for example, to receive a mechanical screw-type interface for conductively connecting with a respective input conductor (not shown). A conductive surface 446 can be arranged over a connector portion of the first and second AC output terminals 415, 416, and a non-conductive surface 448 over another portion of the first and second AC output terminals 415, 416. The non-conductive surface 448 can, for example, insulate the first and second AC output terminals 415, 416 from proximal conductive parts. A cover (not shown) can be attached to the baseplate 425 to at least partially enclose the full-bridge modular POL device 400.

Figure 6:
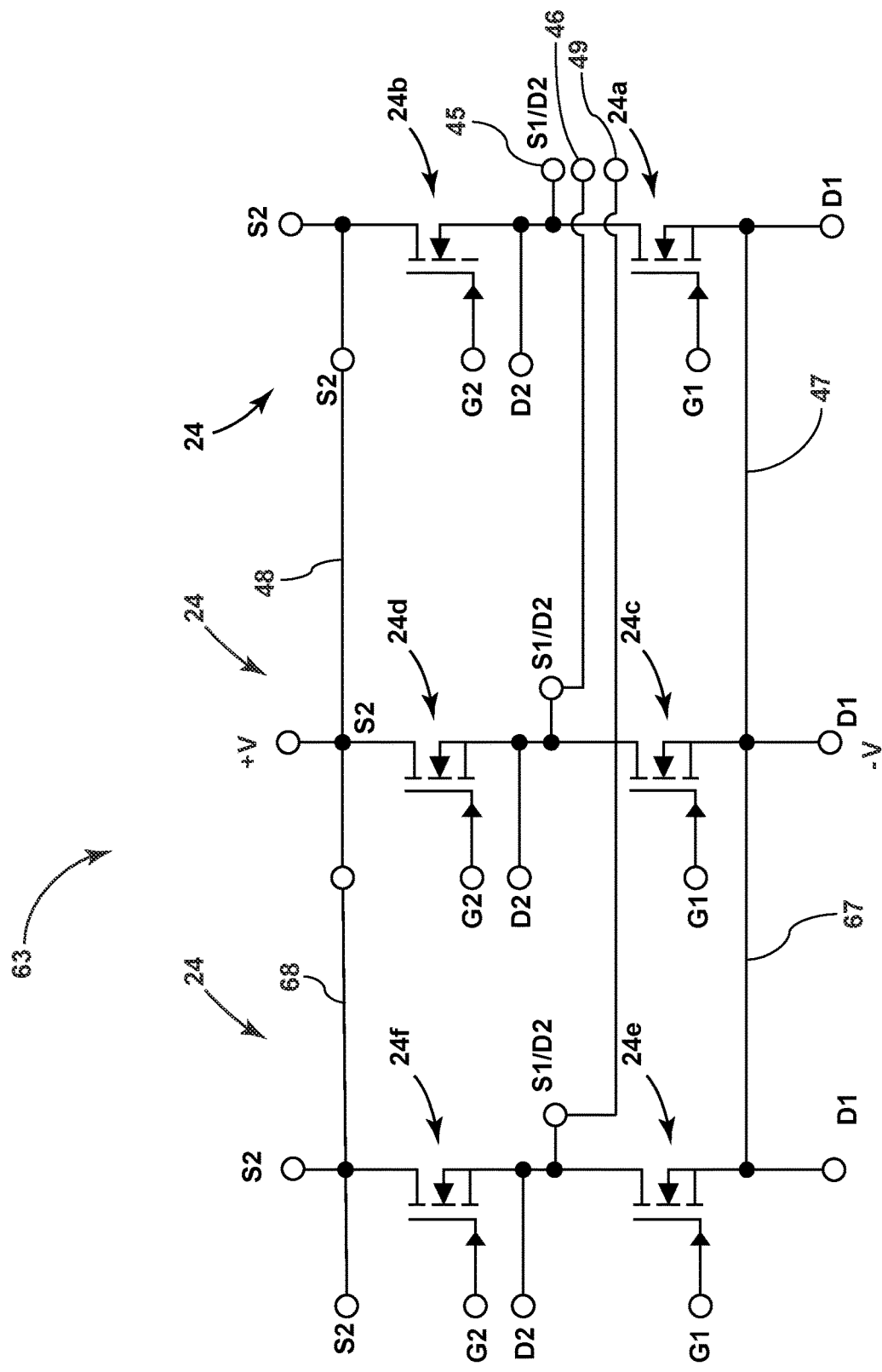
FIG. 6 illustrates a schematic diagram of a conventional three-phase bridge converter circuit.

In a similar fashion, in non-limiting aspects, three first half-bridge POL components 301 can be modularly arranged to cooperatively define a three-phase bridge power converter device. For example, FIG. 6 depicts an electrical schematic view of a conventional three-phase bridge power converter circuit 63 for reference. As will be appreciated, the three-phase bridge power converter circuit 63 comprises three pairs of complimentary semiconductor switching devices 24, depicted as n-channel MOSFET devices. The three pairs of semiconductor switching devices 24 can respectively include the first semiconductor switching device 24a, the second semiconductor switching device 24b, the third semiconductor switching device 24c, the fourth semiconductor switching device 24d, a fifth semiconductor switching device 24e, and a sixth semiconductor switching device 24f. Each of the six semiconductor switching devices 24a, 24b, 24c, 24d, 24e, 24f can comprise a respective source terminal S, gate terminal G, and drain terminal D.

As shown in FIG. 6, the first source terminal Si of first semiconductor switching device 24a is electrically coupled to the second drain terminal D2 of second semiconductor switching device 24b to define the first AC output terminal 45 (S1/D2). The first source terminal Si of third semiconductor switching device 24c is electrically coupled to the second drain terminal D2 of the fourth semiconductor switching device 24d to define the second AC output terminal 46 (S1/D2). The first conductive line 47 can be arranged to electrically couple the first drain terminal D1 of the first semiconductor switching device 24a, and the first drain terminal D1 of the third semiconductor switching device 24c. The second conductive line 48 can electrically couple the second source terminal S2 of the second semiconductor switching device 24b, and the second source terminal S2 of the fourth semiconductor switching device 24d. Additionally, for the three-phase bridge converter circuit 63, the first source terminal S1 of fifth semiconductor switching device 24e is electrically coupled to the second drain terminal D2 of sixth semiconductor switching device 24f to define the third AC output terminal 49 (S1/D2). A third conductive line 67 can be arranged to electrically couple the first drain terminal D1 of the third semiconductor switching device 24c, and the first drain terminal D1 of the fifth semiconductor switching device 24e. A fourth conductive line 68 can electrically couple the second source terminal S2 of the fourth semiconductor switching device 24d, and the second source terminal S2 of the sixth semiconductor switching device 24f.

In operation, a positive DC voltage (+V), can be provided to the second source terminal S2 of the second semiconductor switching device 24b, and the second source terminal S2 of the fourth semiconductor switching device 24d and the second source terminal S2 of the sixth semiconductor switching device 24f. A negative DC voltage (−V) can be provided to the first drain terminal D1 of the first semiconductor switching device 24a and the first drain terminal D1 of the third semiconductor switching device 24c 24d and the second source terminal S2 of the fifth semiconductor switching device 24e. The respective gate terminals G1, G2 of the six semiconductor switching devices 24a, 24b, 24c, 24d, 24e, 24f can be communicatively coupled to one or more gate driver devices or circuits (not shown) configured to operate the semiconductor switching devices 24a, 24b, 24c, 24d, 24e, 24f between conducting and non-conducting states at a predetermined frequency to thereby provide a sinusoidal waveform or three-phase AC output across the first AC output terminal 45, second AC output terminal 46, and the third AC output terminal 49.

Figure 7:
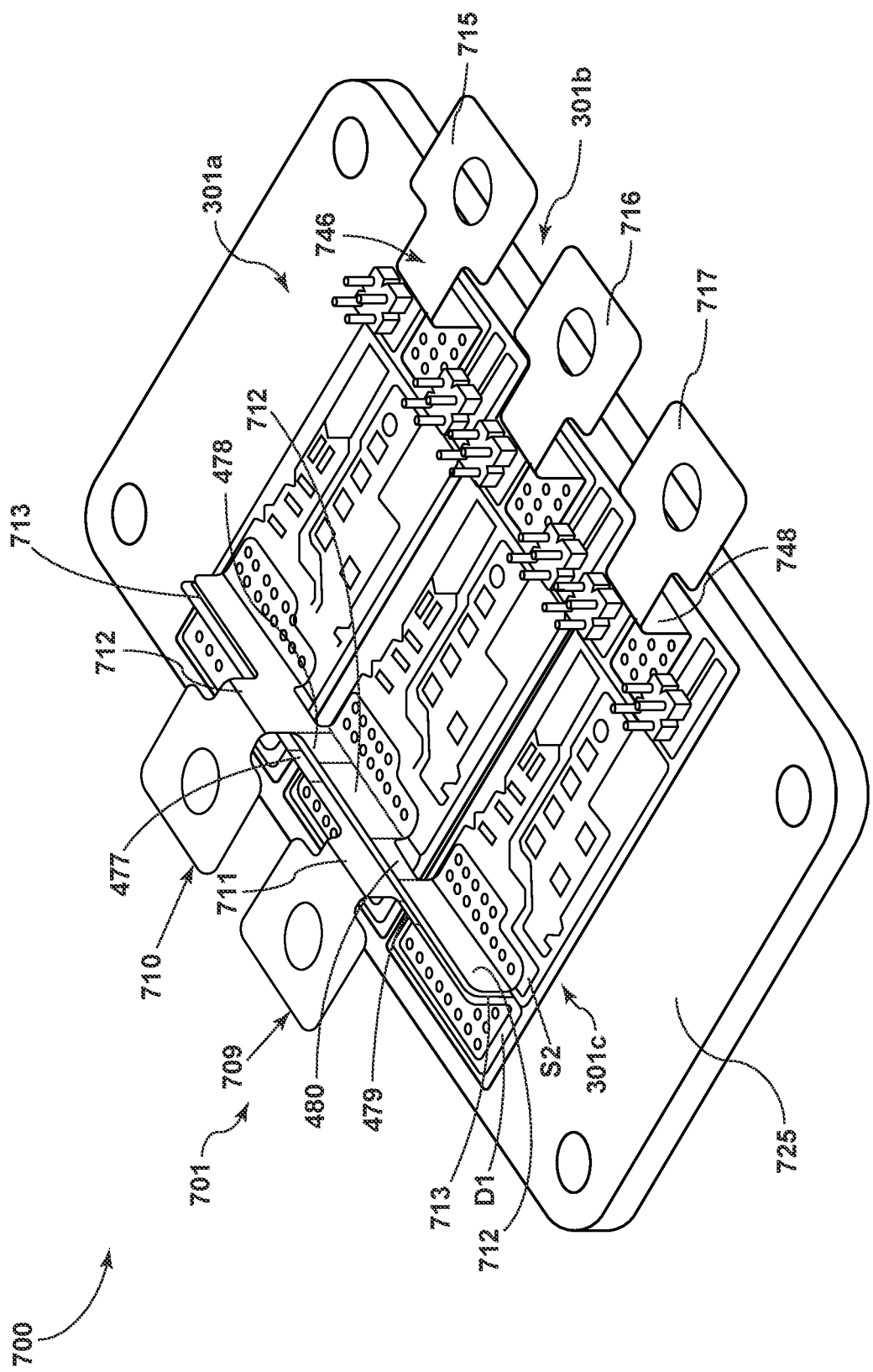
FIG. 7 illustrates a schematic diagram of yet another modular POL device, in accordance with various aspects described herein.

FIG. 7 depicts a non-limiting aspect of a three-phase bridge modular POL device 700. In non-limiting aspects, the three-phase bridge modular POL device 700 can comprise a full-bridge power converter circuit. The three-phase bridge modular POL device 700 can comprise three half-bridge POL components 301 (see FIG. 3B) selected and arranged to cooperatively define a three-phase bridge POL module 701. The three-phase bridge POL module 701 can be mounted on a common electrically insulative baseplate 725 to form the three-phase bridge modular POL device 700. For example, in non-limiting aspects, three first half-bridge POL assemblies, including a first half-bridge POL component 301*a*, a second half-bridge POL component 301*b*, and a third half-bridge POL component 301*c* can be assembled and electrically coupled to each other to cooperatively define the three-phase bridge POL module 701. The three-phase bridge POL module 701 can be assembled onto the common electrically insulative baseplate 725, to define the three-phase bridge modular POL device 700. The selection of the first half-bridge POL component 301*a*, second half-bridge POL component 301*b*, and third half-bridge POL component 301*c*, can be based on a predetermined AC power output conversion demand.

It will be appreciated that while FIG. 7 depicts the first, second, and third half-bridge POL components 301*a*, 301*b*, 301*c* defining the three-phase bridge POL module 701 as being disposed on a single or unitary common electrically insulative baseplate 725, other aspects are not so limited. In other non-limiting aspects, the common electrically insulative baseplate 725 can comprise set of insulative baseplate segments (not shown) arranged to be selectively coupled together to form or define the common electrically insulative baseplate 725.

Non-limiting aspects of the three-phase bridge POL module 701 can include set of DC input terminals 710 extending therefrom. The set of DC input terminals 710 can include a first DC input terminal 711 and a second DC input terminal 712. For example, the first DC input terminal 711 of the three-phase bridge POL module 701 can include the respective first DC input terminals 311 (depicted in FIG. 3B) of the first, second and third half-bridge POL component 301*a*, 301*b*, 301*c*, electrically coupled to each other. Likewise, in non-limiting aspects, the second DC input terminal 712 of the three-phase bridge POL module 701 can include the respective second DC input terminals 312 (depicted in FIG. 3B) of the first, second and third half-bridge POL components 301*a*, 301*b*, 301*c*, electrically coupled to each other. Additionally, non-limiting aspects of the three-phase bridge POL module 701 can further include a first AC output terminal 715, a second AC output terminal 716, and a third AC output terminal 717 extending therefrom. In non-limiting aspects, the first AC output terminal 715 can correspond to the first AC output terminal 315 of the first half-bridge POL component 301*a*, while the second AC output terminal 716 can correspond to the first AC output terminal 315 of the second half-bridge POL component 301*b*, and the third AC output terminal 717 can correspond to the first AC output terminal 315 of the third half-bridge POL component 301*c*.

In non-limiting aspects, the first, second, and third half-bridge POL components 301*a*, 301*b*, 301*c* of the three-phase bridge POL module 701 can include a respective first DC input terminal 711 electrically coupled to the respective drain terminal D1 of the first, second, and third half-bridge POL components 301*a*, 301*b*, 301*c*. The first conductive member 477 can be disposed between and electrically coupled to the respective first DC input terminals 711 of the first and second half-bridge POL components 301*a*, 301*b*, and a third conductive member 479 can be disposed between and electrically coupled to the respective first DC input terminals 711 of the second and third half-bridge POL components 301*b*, 301*c* to cooperatively define the first DC input terminal 711 of the three-phase bridge POL module 701. In this way, the first and third conductive members 477, 479, and the respective first DC input terminals 311 of the first, second, and third half-bridge POL components 301*a*, 301*b*, 301*c*, are electrically coupled together as a node to define the first DC input terminal 711.

In non-limiting aspects, the first, second, and third half-bridge POL components 301*a*, 301*b*, 301*c* of the three-phase bridge POL module 701 can include a respective second DC input terminal 312 electrically coupled to the respective second source terminal S2 of the first, second and third half-bridge POL components 301*a*, 301*b*, 301*c*. The second conductive member 478 can be disposed between and electrically coupled to the respective second DC input terminals 312 of the first and second half-bridge POL components 301*a*, 301*b*, and a fourth conductive member 480 can be disposed between and electrically coupled to the respective second DC input terminals 312 of the second and third half-bridge POL components 301*b*, 301*c*, to cooperatively define the second DC input terminal 712 of the three-phase bridge POL module 701. In this way, the second and fourth conductive members 478, 480, and the respective second DC input terminals 312 of the second and third half-bridge POL components 301*b*, 301*c* are electrically coupled together as a node to define the second DC input terminal 712.

Each of the DC input terminals 710 can be configured or adapted, for example, to receive a mechanical screw-type interface for conductively connecting with a respective input conductor (not shown). A non-conductive or third electrically insulative layer 713 comprising an electrically insulative material (e.g., an insulative sheet) can be disposed between the first DC input terminal 711 and second DC input terminal 712 to prevent conductive contact between the first and second DC input terminals 711, 712 while allowing the first and second DC input terminals 711, 712 to non-conductively abut each other. In non-limiting aspects, the non-conductive layer can include a non-conductive powder coating disposed on the first DC input terminal 711, the second DC input terminal 712, or both. In still other non-limiting aspects, the third electrically insulative layer 713 can comprise an air gap or space between the first DC input terminal 711 and second DC input terminal 712.

Each of first, second, and third AC output terminals 715, 716, 717 can be configured or adapted, for example, to receive a respective mechanical screw-type interface for conductively connecting with a respective input conductor (not shown). A respective conductive surface 746 can be arranged over a connector portion of the first, second, and third AC output terminals 715, 716, 717 and a respective non-conductive surface 748 over another portion of the first, second, and third AC output terminals 715, 716, 717. The respective non-conductive surface 748 can, for example, insulate the first, second, and third AC output terminals 715, 716, 717 from proximal conductive parts. A cover (not shown) can be attached to the common electrically insulative baseplate 725 to at least partially enclose the full-bridge modular POL device 400.

Figure 8:
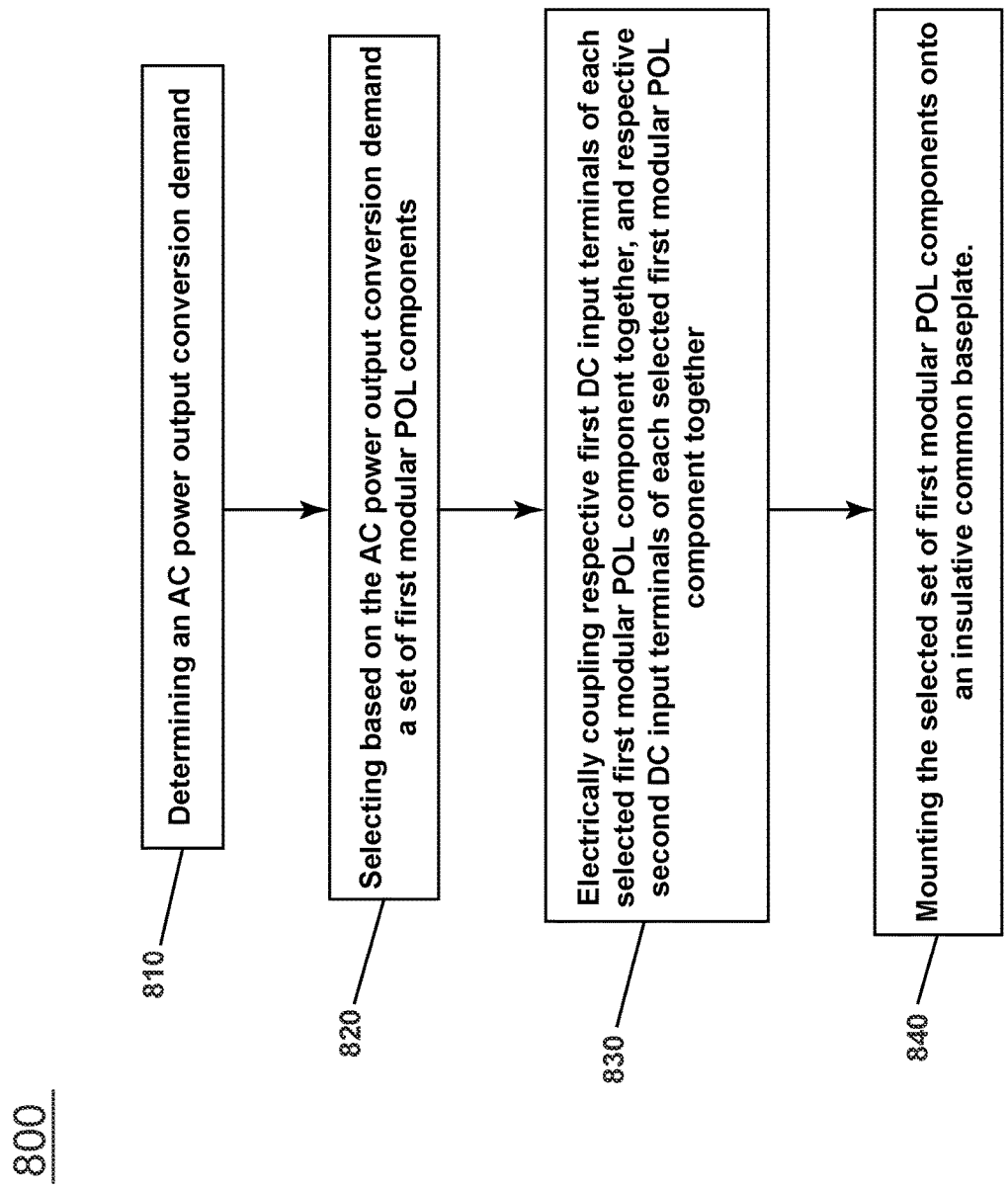
FIG. 8 illustrates a method flow diagram configuring a modular POL device in accordance with various aspects described herein.

FIG. 8 illustrates a non-limiting example of a method 800 of configuring a modular POL device, for example, a half-bridge modular POL device 300 of FIG. 3B. The method 800 can begin, at step 810, by determining an AC power output conversion demand. For example, the AC power output demand can be a desired or predetermined electrical power signal to be supplied to a load. It will be appreciated that the particular AC power output demand for various non-limiting aspects can be a predefined electrical load. The AC power output demand can be based on a conversion of a DC electrical signal to an AC electrical signal. The method 800 can continue at step 820 by selecting, based on the AC power output conversion demand, a set of first modular POL components 301 having a first configuration comprising a dielectric layer 21 having a first side 21*a* and an opposing second side 21*b*, a top conductive layer 14 disposed on the dielectric layer first side 21*a*, a set of semiconductor switching devices 24 each having a first side 27 comprising a respective source terminal, and an opposing second side comprising a respective drain terminal, the set of semiconductor switching devices 24 disposed on the dielectric layer second side 21*b* and arranged to define a first half-bridge converter circuit, the top conductive layer 14 electrically connected to each respective source terminal through the dielectric layer 21, an electrically conductive substrate 8 having a first surface 8*a* facing the second side 21*b* of the dielectric layer 21, electrically coupled to each respective drain terminal of the set of semiconductor switching devices 24, and an opposing second surface 8*b*, a first DC input terminal 311 electrically coupled to a respective source terminal of a first one of the semiconductor switching devices 24, a second DC input terminal 312 electrically coupled to a respective drain terminal of a second one of the semiconductor switching devices 24, a first AC output terminal 315 electrically coupled to a respective drain terminal of the first one of the semiconductor switching devices 24, and a source terminal of the second one of the semiconductor switching devices 24, an electrically insulative baseplate 325, facing and coupled to the conductive substrate 8 second surface 8*b*.

The method 800 can continue, at step 830, by electrically coupling the respective first DC input terminals 311, 312 of each selected first modular POL component 301 together, and the respective second DC input terminals of each selected first modular POL component 301 together to define one of a full-bridge converter circuit and a three-phase bridge converter circuit.

The method 800 can also include, at step 840, mounting the selected set of first modular POL components onto a common electrically insulative baseplate 325.

The sequence depicted is for illustrative purposes only and is not meant to limit the method 800 in any way as it is understood that the portions of the method can proceed in a different logical order, additional or intervening portions can be included, or described portions of the method can be divided into multiple portions, or described portions of the method can be omitted without detracting from the described method.

To the extent not already described, the different features and structures of the various aspects can be used in combination with each other as desired. That one feature is not illustrated in all the aspects is not meant to be construed that it is not included, but is done for brevity of description. Thus, the various features of the different aspects can be mixed and matched as desired to form new aspects of the disclosure, whether the new aspects are expressly described. All combinations or permutations of features described herein are covered by this disclosure.

The aspects disclosed herein provide a half bridge POL module assembled onto direct bond copper substrate to form a building block in a half bridge configuration. This arrangement advantageously provides a POL structure having low inductance and small formfactor for fast switching and high-power density. In addition, the aspects disclosed herein enable a modular "building block" arrangement to enable low inductance POL modules that are readily and easily configurable simply by changing the numbers of POL tiles. In this disclosure, at least three types of POL modules are enabled using the same half bridge building block, i.e., a half bridge module, a full bridge module, and a three-phase module. One advantage that can be realized in the above aspects is that the above described aspects have reduced cost and time to manufacture than previous such POL modules.

To the extent not already described, the different features and structures of the various aspects can be used in combination with each other as desired. That one feature cannot be illustrated in all the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the disclosure, including the best mode, and to enable any person skilled in the art to practice aspects of the disclosure, including making and using any devices or systems and performing any incorporated methods. The features disclosed in the foregoing description, or in the accompanying drawings, can, both separately and in any combination thereof, be material for realizing the disclosure in diverse forms thereof.

Various characteristics, aspects and advantages of the present disclosure may also be embodied in any permutation of aspects of the disclosure, including but not limited to the following technical solutions as defined in the enumerated aspects:

1. A modular power overlay (POL) device, comprising: a first POL component comprising: a first dielectric layer having a first side and an opposing second side; a first conductive layer disposed on the first dielectric layer first side; a set of first semiconductor switching devices each comprising a respective source terminal, drain terminal, and gate terminal, the set of first semiconductor switching devices disposed on the first dielectric layer second side and arranged to cooperatively define a first half-bridge converter circuit, the first conductive layer electrically coupled to each respective source terminal through the first dielectric layer; a first electrically conductive substrate having a first side facing the set of first semiconductor switching devices, electrically coupled to each respective gate terminal of the set of first semiconductor switching devices, and an opposing second side; a first DC input node including a first DC input terminal electrically coupled to a respective drain terminal of a first one of the first semiconductor switching devices; a second DC input node including a second DC input terminal electrically coupled to a respective source terminal of a second one of the first semiconductor switching devices; a first AC output terminal electrically coupled to a respective source terminal of the first one of the first semiconductor switching devices, and a drain terminal of the second one of the first semiconductor switching devices; and an electrically insulative baseplate, facing and coupled to the electrically conductive substrate second side.

2. The modular POL device of the preceding clause, wherein the first AC output terminal is disposed on the first conductive layer and coupled thereto.

3. The modular POL device of any preceding clause, wherein the first DC input terminal and second DC input terminal are disposed on the first conductive layer.

4. The modular POL device of any preceding clause, further comprising a first electrically insulative layer disposed between the first DC input terminal and second DC input terminal.

5. The modular POL device of any preceding clause, further comprising: a second POL component coupled to the electrically insulative baseplate, the second POL component comprising: a second dielectric layer having a first side and an opposing second side; a second conductive layer disposed on the second dielectric layer first side; a set of second semiconductor switching devices each having a respective source terminal, drain terminal, and gate terminal, the set of second semiconductor switching devices disposed on the second dielectric layer second side and arranged to cooperatively define a second half-bridge converter circuit, the second conductive layer electrically coupled to each respective source terminal through the second dielectric layer; a second electrically conductive substrate having a first side facing the set of second semiconductor switching devices, electrically coupled to each respective gate terminal of the set of second semiconductor switching devices, and an opposing second side; a third DC input terminal coupled to a respective drain terminal of a first one of the second semiconductor switching devices; a fourth DC input terminal coupled to a respective source terminal of a second one of the second semiconductor switching devices; and a second AC output terminal electrically coupled to a respective drain terminal of the first one of the second semiconductor switching devices, and a source terminal of the second one of the second semiconductor switching devices; wherein the second POL component is electrically coupled to first POL component to cooperatively define a full bridge converter circuit.

6. The modular POL device of any preceding clause, wherein the first DC input terminal of the first POL component is electrically coupled to the third DC input terminal of the second POL component by a first conductive member to define the first DC input node.

7. The modular POL device of any preceding clause, wherein the second DC input terminal of the first POL component is coupled to the fourth DC input terminal of the second POL component by a second conductive member to define the second DC input node.

8. The modular POL device of any preceding clause, wherein the second AC output terminal is disposed on the second conductive layer.

9. The modular POL device of any preceding clause, wherein the third DC input terminal of the second POL component and the fourth DC input terminal of the second POL component are disposed on the second conductive layer.

10. The modular POL device of any preceding clause, further comprising a second electrically insulative layer disposed between the third DC input terminal of the second POL component and fourth DC input terminal of the second POL component.

11. The modular POL device of any preceding clause, further comprising: a third POL component coupled to the electrically insulative baseplate, the third POL component comprising: a third dielectric layer having a first side and an opposing second side; a third conductive layer disposed on the first dielectric layer first side; a set of third semiconductor switching devices each having a respective source terminal, drain terminal, and gate terminal, the set of third semiconductor switching devices disposed on the second dielectric layer second side and arranged to cooperatively define a third half-bridge converter circuit, the third conductive layer electrically coupled to each respective source terminal through the third dielectric layer; a third electrically conductive substrate having a first side facing the set of third semiconductor switching devices, electrically coupled to each respective gate terminal of the set of third semiconductor switching devices, and an opposing second side; a fifth DC input terminal coupled to a respective drain terminal of a first one of the third semiconductor switching devices; a sixth DC input terminal coupled to a respective source terminal of a second one of the third semiconductor switching devices; a third AC output terminal electrically coupled to a respective drain terminal of the first one of the third semiconductor switching devices, and a source terminal of the second one of the third semiconductor switching devices; and wherein the third POL component is electrically coupled to the second POL component to cooperatively define a three-phase bridge converter circuit.

12. The modular POL device of any preceding clause, wherein the fifth DC input terminal of the third POL component is electrically coupled to the third DC input terminal of the second POL component.

13. The modular POL device of any preceding clause, wherein the sixth DC input terminal of the third POL component is coupled to the fourth DC input terminal of the second POL component.

14. The modular POL device of any preceding clause, wherein the third AC output terminal is disposed on the third conductive layer.

15. The modular POL device of any preceding clause, wherein the fifth DC input terminal of the third POL component and sixth DC input terminal of the third POL component are disposed on the third conductive layer.

16. The modular POL device of any preceding clause, further comprising a third electrically insulative layer disposed between the fifth DC input terminal of the third POL component and sixth DC input terminal of the third POL component.

17. A method of configuring a modular POL device, comprising: selecting a set of first modular POL components having a first configuration comprising: a first dielectric layer having a first side and an opposing second side; a first conductive layer disposed on the first dielectric layer first side; a set of first semiconductor switching devices each having a respective source terminal, drain terminal, and gate terminal, the set of first semiconductor switching devices disposed on the first dielectric layer second side and arranged to cooperatively define a first half-bridge converter circuit, the first conductive layer electrically coupled to each respective source terminal through the first dielectric layer; a first electrically conductive substrate having a first side facing the set of first semiconductor switching devices, electrically coupled to each respective gate terminal of the set of first semiconductor switching devices, and an opposing second side; a first DC input terminal electrically coupled to a respective source terminal of a first one of the first semiconductor switching devices; a second DC input terminal electrically coupled to a respective drain terminal of a second one of the first semiconductor switching devices; and a first AC output terminal electrically coupled to a respective drain terminal of the first one of the first semiconductor switching device, and a source terminal of the second one of the first semiconductor switching devices; electrically coupling the respective first DC input terminals of the set of first modular POL components together to define a first DC input node, and electrically coupling the respective second DC input terminals of the set of first modular POL components together to define a second DC input node; and mounting the set of first modular POL components onto an electrically insulative common baseplate.

18. The method of any preceding clause, wherein electrically coupling the respective first DC input terminals of the set of first modular POL components together is via at least one first electrically conductive member.

19. The method of any preceding clause, wherein electrically coupling the respective second DC input terminals of the set of first modular POL components together is via at least one second electrically conductive member.

20. The method of any preceding clause, further comprising determining an AC power output conversion demand, wherein the selecting the set of first modular POL components is based on the AC power output conversion demand.

What is claimed is:

1. A modular power overlay (POL) device, comprising:
   a first POL component comprising:
     a first dielectric layer having a first side and an opposing second side;
     a first conductive layer disposed on the first dielectric layer first side;
     a set of first semiconductor switching devices each comprising a respective source terminal, drain terminal, and gate terminal, the set of first semiconductor switching devices disposed on the first dielectric layer second side and arranged to cooperatively define a first half-bridge converter circuit, the first conductive layer electrically coupled to each respective source terminal through the first dielectric layer;
     a first electrically conductive substrate having a first side facing the set of first semiconductor switching devices, electrically coupled to each respective gate terminal of the set of first semiconductor switching devices, and an opposing second side;
     a first DC input node including a first DC input terminal electrically coupled to a respective drain terminal of a first one of the set of first semiconductor switching devices;
     a second DC input node including a second DC input terminal electrically coupled to a respective source terminal of a second one of the set of first semiconductor switching devices;
     a first AC output terminal electrically coupled to a respective source terminal of the first one of the set of first semiconductor switching devices, and a drain terminal of the second one of the set of first semiconductor switching devices; and
   an electrically insulative baseplate, facing and coupled to the second side of the first electrically conductive substrate, wherein the first electrically conductive substrate is positioned between the set of first semiconductor switching devices and the electrically insulative baseplate.

2. The modular POL device of claim 1, wherein the first AC output terminal is disposed on the first conductive layer and coupled thereto.

3. The modular POL device of claim 1, wherein the first DC input terminal and second DC input terminal are disposed on the first conductive layer.

4. The modular POL device of claim 3, further comprising a first electrically insulative layer disposed between the first DC input terminal and second DC input terminal.

5. The modular POL device of claim 1, further comprising:
   a second POL component coupled to the electrically insulative baseplate, the second POL component comprising:
     a second dielectric layer having a first side and an opposing second side;
     a second conductive layer disposed on the second dielectric layer first side;
     a set of second semiconductor switching devices each having a respective source terminal, drain terminal, and gate terminal, the set of second semiconductor switching devices disposed on the second dielectric layer second side and arranged to cooperatively define a second half-bridge converter circuit, the second conductive layer electrically coupled to each respective source terminal through the second dielectric layer;
     a second electrically conductive substrate having a first side facing the set of second semiconductor switching devices, electrically coupled to each respective gate terminal of the set of second semiconductor switching devices, and an opposing second side;
     a third DC input terminal coupled to a respective drain terminal of a first one of the second semiconductor switching devices;
     a fourth DC input terminal coupled to a respective source terminal of a second one of the second semiconductor switching devices; and
     a second AC output terminal electrically coupled to a respective drain terminal of the first one of the second semiconductor switching devices, and a source terminal of the second one of the second semiconductor switching devices;
   wherein the second POL component is electrically coupled to first POL component to cooperatively define a full bridge converter circuit.

6. The modular POL device of claim 5, wherein the first DC input terminal of the first POL component is electrically coupled to the third DC input terminal of the second POL component by a first conductive member to define the first DC input node.

7. The modular POL device of claim 6, wherein the second DC input terminal of the first POL component is coupled to the fourth DC input terminal of the second POL component by a second conductive member to define the second DC input node.

8. The modular POL device of claim 6, further comprising:
   a third POL component coupled to the electrically insulative baseplate, the third POL component comprising:
     a third dielectric layer having a first side and an opposing second side;
     a third conductive layer disposed on the first dielectric layer first side;
     a set of third semiconductor switching devices each having a respective source terminal, drain terminal, and gate terminal, the set of third semiconductor switching devices disposed on the second dielectric layer second side and arranged to cooperatively define a third half-bridge converter circuit, the third conductive layer electrically coupled to each respective source terminal through the third dielectric layer;
     a third electrically conductive substrate having a first side facing the set of third semiconductor switching devices, electrically coupled to each respective gate terminal of the set of third semiconductor switching devices, and an opposing second side;

a fifth DC input terminal coupled to a respective drain terminal of a first one of the third semiconductor switching devices;

a sixth DC input terminal coupled to a respective source terminal of a second one of the third semiconductor switching devices;

a third AC output terminal electrically coupled to a respective drain terminal of the first one of the third semiconductor switching devices, and a source terminal of the second one of the third semiconductor switching devices; and wherein the third POL component is electrically coupled to the second POL component to cooperatively define a three-phase bridge converter circuit.

9. The modular POL device of claim 8, wherein the fifth DC input terminal of the third POL component is electrically coupled to the third DC input terminal of the second POL component.

10. The modular POL device of claim 9, wherein the sixth DC input terminal of the third POL component is coupled to the fourth DC input terminal of the second POL component.

11. The modular POL device of claim 8, wherein the third AC output terminal is disposed on the third conductive layer.

12. The modular POL device of claim 8, wherein the fifth DC input terminal of the third POL component and sixth DC input terminal of the third POL component are disposed on the third conductive layer.

13. The modular POL device of claim 8, further comprising a third electrically insulative layer disposed between the fifth DC input terminal of the third POL component and sixth DC input terminal of the third POL component.

14. The modular POL device of claim 5, wherein the second AC output terminal is disposed on the second conductive layer.

15. The modular POL device of claim 5, wherein the third DC input terminal of the second POL component and the fourth DC input terminal of the second POL component are disposed on the second conductive layer.

16. The modular POL device of claim 15, further comprising a second electrically insulative layer disposed between the third DC input terminal of the second POL component and fourth DC input terminal of the second POL component.

* * * * *